United States Patent
Zhang et al.

(10) Patent No.: US 10,283,682 B2
(45) Date of Patent: May 7, 2019

(54) LED PACKAGE STRUCTURE AND LED LIGHT-EMITTING DEVICE

(71) Applicant: KAISTAR LIGHTING (XIAMEN) CO., LTD., Xiamen (CN)

(72) Inventors: Jingqiong Zhang, Xiamen (CN); Tzuchi Cheng, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 15/701,367

(22) Filed: Sep. 11, 2017

(65) Prior Publication Data
US 2018/0013040 A1    Jan. 11, 2018

Related U.S. Application Data

(62) Division of application No. 15/202,499, filed on Jul. 5, 2016, now Pat. No. 9,793,449.

(30) Foreign Application Priority Data

Mar. 30, 2016 (CN) .......................... 2016 1 0190008

(51) Int. Cl.
  *H01L 33/00*       (2010.01)
  *H01L 33/50*       (2010.01)

(52) U.S. Cl.
  CPC .......... *H01L 33/508* (2013.01); *H01L 33/504* (2013.01)

(58) Field of Classification Search
  CPC .... H01L 33/508; H01L 33/505; H01L 33/504
  USPC .......................................................... 257/98
  See application file for complete search history.

(56) References Cited

U.S. PATENT DOCUMENTS

| | | | |
|---|---|---|---|
| 2010/0123855 A1 | 5/2010 | Shin ................................ | 349/61 |
| 2012/0119234 A1 | 5/2012 | Shioi et al. ..................... | 257/88 |
| 2012/0306356 A1* | 12/2012 | Yoon ..................... | C04B 35/597 |
| | | | 313/503 |
| 2013/0169144 A1 | 7/2013 | Chou et al. .................... | 313/498 |
| 2016/0104820 A1 | 4/2016 | Lim et al. ....................... | 33/504 |
| 2016/0104827 A1 | 4/2016 | Hong et al. .................... | 33/507 |

(Continued)

FOREIGN PATENT DOCUMENTS

| CN | 101026206 A | 8/2007 |
|---|---|---|
| CN | 101262032 A | 9/2008 |

(Continued)

OTHER PUBLICATIONS

The Chinese First Examination Report of corresponding Chinese patent Application No. 201610190008.8, dated Nov. 3, 2017.

(Continued)

*Primary Examiner* — David S Blum
(74) *Attorney, Agent, or Firm* — WPAT, PC

(57) ABSTRACT

The present disclosure provides a LED package structure and a LED light-emitting device. The LED package structure comprises a LED chip and a wavelength converting layer covering the LED chip. The wavelength converting layer contains red phosphor, which has lower amount in edge portion than in center portion. It is possible to avoid direct or indirect excitation for generating red light in edge portion of the LED chip by adjusting the amount of red phosphor in edge portion to be lower, so that the color temperature in edge portion may be adjusted toward to high color temperature, and thus the phenomenon of yellow halo may be alleviated.

13 Claims, 10 Drawing Sheets

(56) References Cited

U.S. PATENT DOCUMENTS

2016/0290572 A1    10/2016  Heemstra ............................ 5/28
2016/0372642 A1    12/2016  Cho et al. ....................... 33/505
2017/0062675 A1     3/2017  Lim et al.
2017/0069606 A1     3/2017  Gould et al.

FOREIGN PATENT DOCUMENTS

| CN | 101872817 A | 10/2010 |
| CN | 201893379 U | 7/2011 |
| CN | 102683542 A | 9/2012 |
| CN | 103367609 A | 10/2013 |
| CN | 203277496 U | 11/2013 |
| CN | 103618040 A | 3/2014 |
| CN | 103872221 A | 6/2014 |

OTHER PUBLICATIONS

National Intellectual Property Administration, "Office Action", dated Jul. 11, 2018.

\* cited by examiner

US 10,283,682 B2

LED PACKAGE STRUCTURE AND LED LIGHT-EMITTING DEVICE

CROSS-REFERENCE TO RELATED APPLICATIONS

This application is a divisional of application Ser. No. 15/202,499, filed on Jul. 5, 2016, now U.S. Pat. No. 9,793,449, which is based on and claims priority to Chinese Patent Application No. 201610190008.8, filed on Mar. 30, 2016. The contents of the above-mentioned patent applications are hereby incorporated by reference in their entirety and made a part of this specification.

TECHNICAL FIELD

The present disclosure relates to afield of semiconductor technology, and particularly to a LED package structure and a LED light-emitting device.

BACKGROUND

As development of lighting technology grows, light-emitting diodes (LEDs) have been used in more and more lamps as a light source to save energy. In the LED light source, LED chip is used as a core of the light source to convert electrical energy into visible light. It is common to use blue-light LED chips in LED light-emitting devices for emitting white light (hereafter, simply called "white-light LED light-emitting device"), but the light emitted from the blue-light LED chips cannot be used directly for illumination and thus the blue-light LED chip has to be packaged and then the light emitted therefrom can be used for illumination after adjustment on the color thereof.

However, the white light emitted from the white-light LED light-emitting device may present obvious yellow halo due to the LED package structure in the prior art. The phenomenon of yellow halo may be more obvious especially in the case that a rated color temperature of the white-light LED light-emitting device is in a range of cold white-light. Such phenomenon may have impact on the illumination effects so that the illumination effects may be degraded.

SUMMARY

The embodiments of the present disclosure provide a LED package structure and a LED light-emitting device, which can substantially avoid the technical problems in the related art that the light emitted from the white-light LED may present obvious yellow halo due to the LED package structure so that the illumination effects may be degraded.

To achieve the above technical objects, the embodiments of the present disclosure provide technical solutions as follows.

In the first aspect of the present disclosure, embodiments of the present disclosure provide a LED package structure including: a LED chip and a wavelength converting layer covering the LED chip, where the wavelength converting layer includes a red phosphor, which has lower amount in an edge portion than in a center portion.

In the second aspect of the present disclosure, embodiments of the present disclosure provide a LED package structure including: a LED chip and a wavelength converting layer covering the LED chip, the wavelength converting layer including a first wavelength converting sub-layer and a second wavelength converting sub-layer, wherein the first and second wavelength converting sub-layers contain a red phosphor, which has lower amount in the first wavelength converting sub-layer than in the second wavelength converting sub-layer; the first wavelength converting sub-layer is provided surrounding sidewalls of the LED chip; the second wavelength converting sub-layer is provided covering the first wavelength converting sub-layer and the LED chip.

In the third aspect, embodiments of the present disclosure provide a LED light-emitting device including: a LED chip and a wavelength converting layer covering the LED chip, wherein the LED light-emitting device has a dominant wavelength being maintained stable at a variety of emitting angles.

In the fourth aspect of the present disclosure, embodiments of the present disclosure provide a LED light-emitting device including: a LED chip and a wavelength converting layer covering the LED chip, wherein the LED light-emitting device has a color temperature being maintained stable at a variety of emitting angles.

In the LED package structure and the LED light-emitting device provided by the embodiments of the present disclosure, the red phosphor in the wavelength converting layer has a lower amount in an edge portion than in a center portion, and thus direct or indirect excitation for generating red light in an edge portion of the LED chip may be avoided by decreasing the amount of the red phosphor in the edge portion, so that the color temperature in the edge portion may be adjusted toward to a higher color temperature, and thus the problem of yellow halo may be alleviated.

The above description is merely a brief introduction of the technical solutions of the present disclosure, so that the technical means of the present disclosure may be clearly understood, and implemented according to the description of the specification, and the above and other technical objects, features and advantages of the present disclosure may be more obvious based on the embodiments of the present disclosure as follows.

BRIEF DESCRIPTION OF THE DRAWINGS

A variety of other advantages and benefits would be clear and obvious to skills in the art upon reading following preferable embodiments. Drawings are merely used to illustrate preferable embodiments and should not be regarded as limitation on the present disclosure. Furthermore, same reference numbers are used to represent same or similar components throughout drawings, in which.

DESCRIPTION OF THE EMBODIMENTS

In the following, description will be given in detail on the exemplary embodiments of the present disclosure, in connection with the accompanying drawing. Although drawings show the exemplary embodiments of the present disclosure, it should be appreciated that the present disclosure may be implemented in various ways without being limited by the embodiments set forth herein. On the contrary, these embodiments are provided for thorough understanding of the present disclosure, and completely conveying the scope of the present disclosure to the skills in the art.

To implement the present disclosure, the applicants make investigation and research on the light-emitting principle and display characters of LED, and make deep analysis on the phenomenon and the generating cause of the yellow halo, as follows:

White-light LED light-emitting device has such a light-emitting principle that a phosphor may be excited by a light emitted from a LED chip, which normally is a blue light or a ultraviolet light, so that light with colors which are complementary to each other (hereafter, called "complementary colors") may be generated and become white light after superposition. In a light-emitting device using a blue-light LED chip in the prior art as an example, a phosphor layer may be provided around the blue-light LED chip, and generally includes three colors of red, yellow, and green phosphors, or two colors of red and yellow or red and green phosphors. The blue light emitted from the blue-light LED chip may excite phosphors of other colors to generate complementary colors, which may generate white light after superposition.

Figure 1:
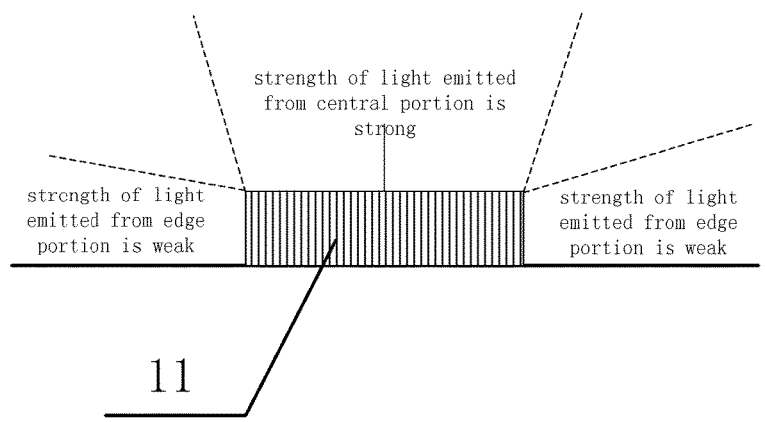
FIG. 1 is a schematic diagram of a LED chip.

FIG. 1 is a schematic view of a LED chip. As shown in FIG. 1, the LED chip 11, which is a blue-light LED chip as an example, may emit blue light, which has different strength at various emitting angles.

It should be noted that, said emitting angle refers to an angle between a light-emitting direction and a direction perpendicular to an upper surface of the LED chip, wherein, the direction perpendicular to the upper surface of the LED chip is an emitting angle of 0°, and the direction parallel to the upper surface of the LED chip is an emitting angle of ±90°. More particularly, the emitting angle of +90° refers to a direction perpendicular to the upper surface of the LED chip obtained by rotating 90° in a counter-clockwise direction from the direction parallel to the upper surface of the LED chip, and the emitting angle of −90° refers to a direction perpendicular to the upper surface of the LED chip obtained by rotating 90° in a clockwise direction from the direction parallel to the upper surface of the LED chip, As shown in FIG. 1, in the central portion of the LED chip 11, i.e., in the case that the emitting angle is around 0°, e.g., in a range of ±30°, the emitting strength of blue light is higher, while in the edge portion of the LED chip 11, i.e., in the case that the emitting angle is near 90°, e.g., in a range of ±80° to ±90°, the emitting strength of blue light is lower. Therefore, the strengths of light in the two regions of central portion and edge portion are significantly different. However, in the portion between the central portion and the edge portion, the strength of light may be gradually decreased as the increase of the emitting angles.

The emitting angles in the central portion are the main emitting angles in a LED light-emitting device, and thus, amount of respective phosphor in the wavelength converting layer may be matched with the strength of light in the central portion first. However, in the current white-light LED light-emitting device, the wavelength layers in the central portion and in the edge portion in a LED chip may have substantially same thickness (meanwhile phosphor of each color in the whole phosphor layer have substantially same densities), or the phosphor in the wavelength converting layer in the edge portion may even have higher density than in the central portion due to the processes. Therefore, the strength of light in the edge portion may be lower, which may lead to the surplus of the phosphor in the edge portion compared with the amount of the phosphor in the central portion, and the blue light emitted from the edge portion in the LED chip may be inadequate for exciting all phosphors, and thus there may be parts of phosphors of each color left unexcited.

Table 1 shows exciting characters of phosphors, wherein the symbol of "✓" means the phosphor is excitable. It may be understood from the exciting characters of phosphors of each color as shown in table 1, if there are red phosphor left unexcited in the edge portion in the LED chip, the green light and yellow light generated by being excited may continue to excite the red phosphor, and thus the amount of red light emitted at emitting angles in the edge portion in the LED light-emitting device may be increased and the whole color temperature of the light emitted from the edge portion in the LED light-emitting device may be decreased due to the low color temperature of red light. Therefore, the yellow halo may appear.

TABLE 1

| Excitable band of wavelength | Exciting Characters of Phosphors | | | |
| --- | --- | --- | --- | --- |
| | Ultra-violet light | Blue light | Green light | Yellow light |
| Green phosphor | ✓ | ✓ | | |
| Yellow phosphor | ✓ | ✓ | ✓ | |
| Red phosphor | ✓ | ✓ | ✓ | ✓ |

Furthermore, blue light in the edge portion may be inadequate, and thus, the ratio of blue light in the emitted mixed light may be lower. The blue light is a light of high color temperature, and thus the deficiency of light of high color temperature may cause the decrease of the whole color temperature of emitted light, which may also lead to the phenomenon of yellow halo.

Figure 2:
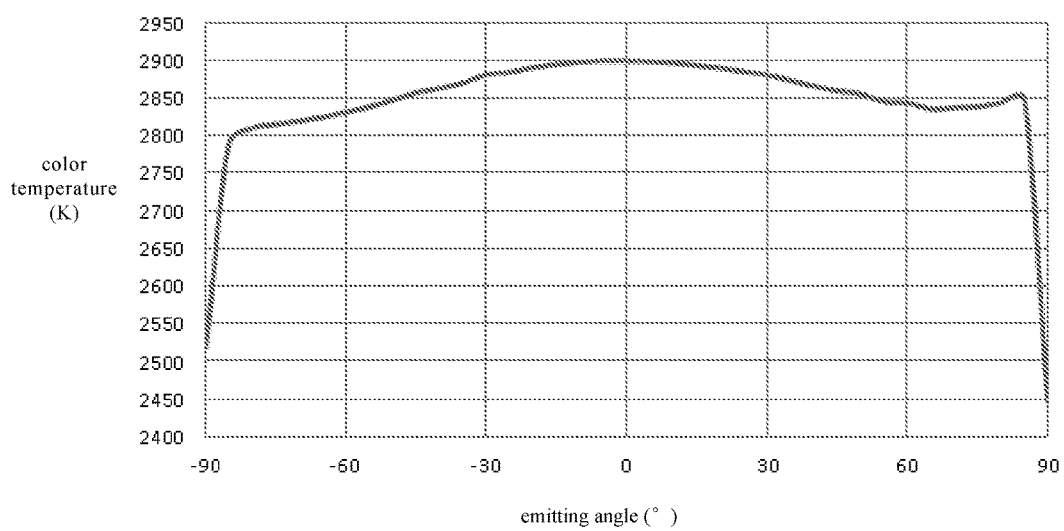
FIG. 2 is a schematic diagram showing non-uniformity of the color of light emitted from a LED light-emitting device.
Figure 3:
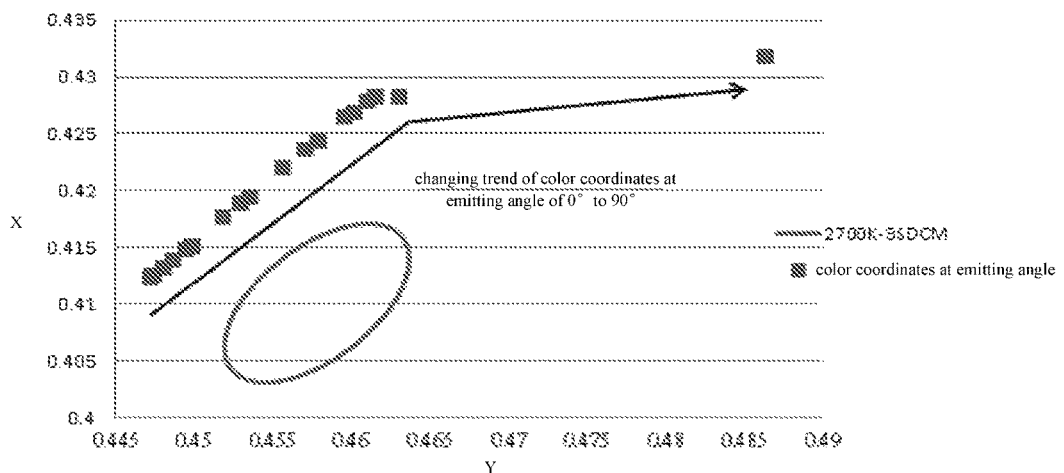
FIG. 3 is another schematic diagram showing non-uniformity of the color of light emitted from a LED light-emitting device.

FIG. 2 is a schematic diagram showing non-uniformity of the color of light emitted from a LED light-emitting device, and FIG. 3 is another schematic diagram showing non-uniformity of the color of light emitted from a LED light-emitting device. Due to the above reasons, the non-uniformity of color of light emitted from the whole LED light-emitting device is shown in FIG. 2. It can be seen, from a perspective of uniformity of color of light, that the current LED light-emitting device has a high color temperature in the central portion (at the emitting angle of 0°) and a low color temperature in the edge portion. As shown in FIG. 3, it can be seen, from a perspective of color coordinates, that there are fewer yellow light and green light, but more red light in the edge portion (at the emitting angle of ±90°).

Based on the above analysis on the light emitting principle of LED, the embodiments of the present disclosure may provide a technical solution of alleviating the phenomenon of yellow halo by adjusting the distribution of the amount of red phosphor in the LED light-emitting device.

Hereafter, detailed description are made on a LED package structure, a LED light-emitting device, and a phosphor coating method provided by the embodiments of the present disclosure, in connection with the drawings.

First Embodiment

Figure 4:
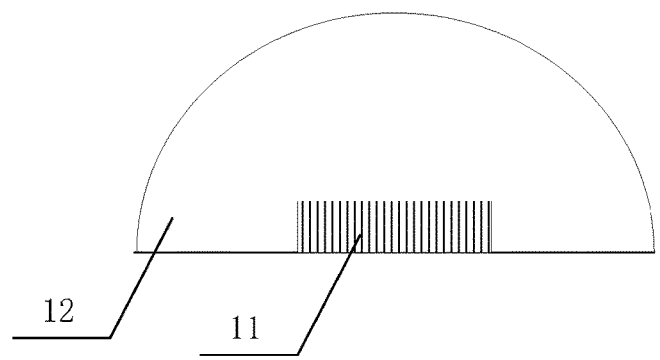
FIG. 4 is schematic diagram of a LED package structure provided by the first embodiment of the present disclosure.

FIG. 4 is schematic diagram of a LED package structure provided by the first embodiment of the present disclosure. The LED package structure in the present embodiment may be used for a while-light LED light-emitting device, such as cold-white-light LED light-emitting device or warm-white-light LED light-emitting device, without limitation on the color temperature of the LED light-emitting device in the present embodiment. As shown in FIG. 4, the LED package structure may include a LED chip 11 and a wavelength converting layer 12.

More particularly, the wavelength converting layer 12 may cover the LED chip 11. The amount of red phosphor in the wavelength converting layer 12 is lower in the edge portion than in the central portion in the LED chip 11. The wavelength converting layer as cited herein may particularly refer to a phosphor adhesive layer containing phosphor or other medium layer carrying phosphor and capable of transmitting light.

It should be noted that, the amount of red phosphor cited herein is an absolute amount of red phosphor, or the mass of red phosphor. The amount of red phosphor may be determined based on the density of red phosphor and the volume of the wavelength converting layer.

In practice, the wavelength converting layer may have relative even thickness, or the thickness of the wavelength converting layer may have a certain tolerance. Therefore, it may be feasible to use the density of red phosphor to represent the amount of red phosphor, and the higher the density of red phosphor is, the higher the amount of red phosphor is, or conversely the lower the density of red phosphor is, the lower the amount of red phosphor is. In the description and illustration of the following embodiments, "amount of phosphor" may be mainly described for the sake of conciseness. However, one skilled in the art should understand from the above explanation that, the following description and examples are applicable to "density of phosphor" as well.

The technical solution of the present embodiment may decrease the amount of red phosphor in edge portion of the LED and thus reduces the red light directly excited by the blue light from red phosphor or indirectly excited by yellow light or green light from red phosphor. Therefore, the color temperature in edge portion may be adjusted toward to high color temperature, and the problem caused by yellow halo may be alleviated.

More particularly, in the wavelength converting layer 12, the amount of red phosphor may be gradually changed from the central portion to the edge portion in the LED chip 11, and may also be abruptly changed from the central portion to the edge portion in the LED chip 11.

Figure 5:
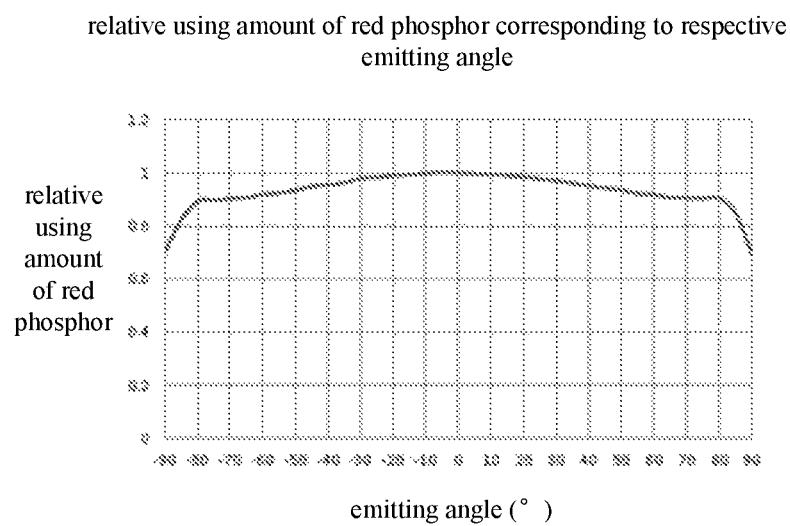
FIG. 5 is an example showing the distribution of a red phosphor in a wavelength converting layer.

As an alternative embodiment, the amount of red phosphor in the wavelength converting layer 12 may be decreased as the absolute value of emitting angle increases from the central portion to the edge portion in the LED chip 11. FIG. 5 is an example showing the distribution of the red phosphor in the wavelength converting layer 12. As shown in FIG. 5, in the white-light LED light-emitting device of 2700 K as an example, when the emitting angle is in a range of −80° to 80°, in the LED package structure, the relative amount of red phosphor may be gradually decreased as the absolute value of emitting angle increases, which is shown in FIG. 5 that the slope of the curve is small, while when the emitting angle is greater than 80° or less than −80°, the relative amount of red phosphor may be rapidly decreased as the absolute value of emitting angle increases, which is shown in FIG. 5 that the slope of the curve is large. The vertical axis in FIG. 5 is a relative using amount of red phosphor, i.e., the amount of red phosphor corresponding to portion with the emitting angle of 0° is the most and set as 1, and the distribution of phosphor in other portions may be quantified with 1 as a reference. It can be seen from the drawing that the using amount of red phosphor is decreased by 10% to 30% in the case that the emitting angle is greater than 80° or less than −80°.

Comparing between FIG. 5 and FIG. 2, it can be seen that, the above distribution of red phosphor may be substantially corresponding to the curve of uniformity of color of light of prior LED light-emitting device as shown in FIG. 2, so that the changes of uniformity of color of light is small and gentle throughout the emitting angles.

Figure 6:
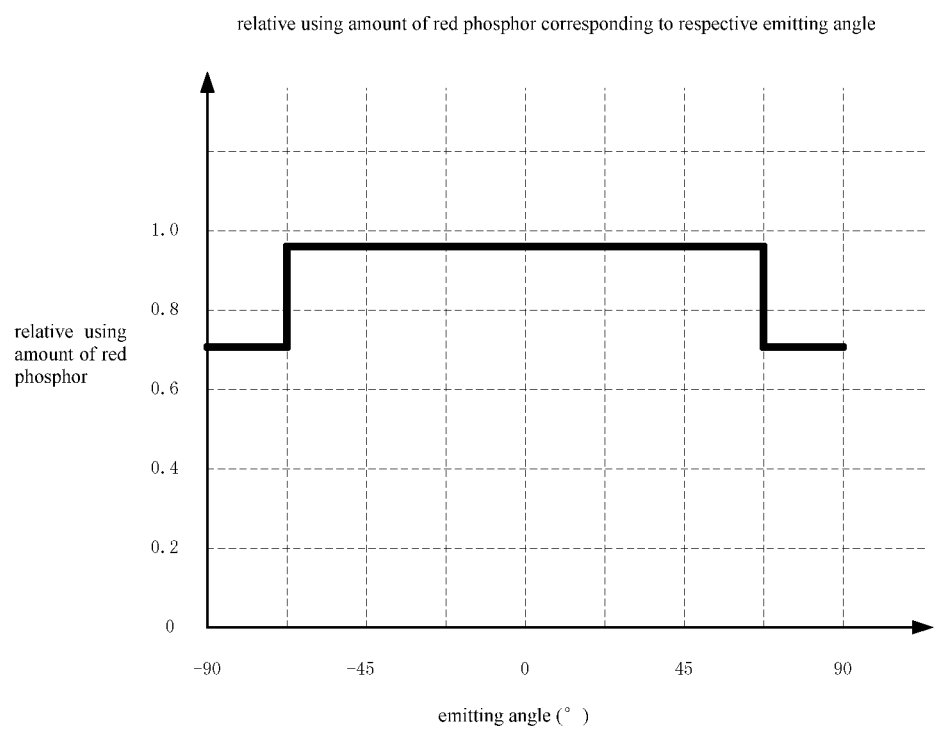
FIG. 6 is another example showing the distribution of the red phosphor in the wavelength converting layer.

As an alternative embodiment, the distribution of the amount of red phosphor may be stepwise, i.e., from the central portion to the edge portion in the LED chip 11, the wavelength converting layer 12 may be divided into at least two parts, in which the amounts of red phosphor are different and in each part, the amount of red phosphor is constant everywhere. FIG. 6 is another example showing the distribution of the red phosphor in the wavelength converting layer 12. As shown in FIG. 6, the amount of red phosphor is higher in the first part near the central portion in the LED chip 11 than in the second part near the edge portion in the LED chip 11. It can be seen from FIG. 6 that, the distribution of the amount of red phosphor seems to be stepwise. More particularly, the amount of red phosphor is high in a case of emitting angles within about ±72.5°, while the amount of red phosphor is decreased to about 70% in a case of emitting angles from ±72.5° to 90°. With the stepwise-distribution of the amount of red phosphor in the phosphor layer, the manufacturing of the phosphor layer may be easier in the practical production procedure and meanwhile the effect of alleviating the phenomenon of yellow halo may be maintained.

Figure 7:
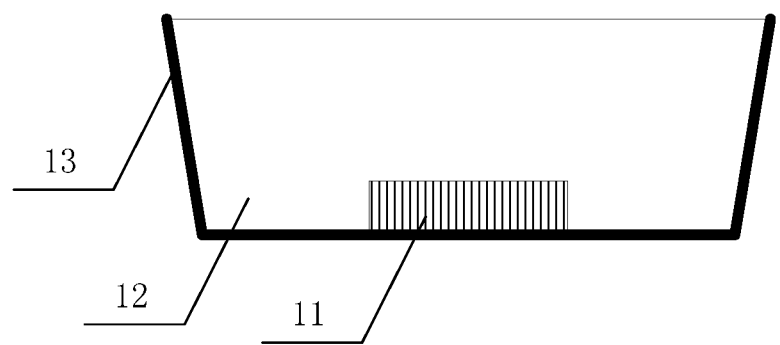
FIG. 7 is a schematic diagram of another LED package structure provided by the first embodiment of the present disclosure.

Furthermore, in addition to the LED chip 11 and the wavelength converting layer 12, the LED package structure may further include a bowl-like cup 13. FIG. 4 shows the LED package structure without the bowl-like cup 13, and the bowl-like cup 13 may be used to adjust the emitting angles, if the bowl-like cup 13 is included in the LED package structure. FIG. 7 is a schematic diagram of another LED package structure provided by the first embodiment of the present disclosure. As shown in FIG. 7, the LED chip 11 may be provided on the bottom of the bowl-like cup 13, and the bowl-like cup 13 may be filled with the wavelength converting layer 12 inside.

Figure 8:
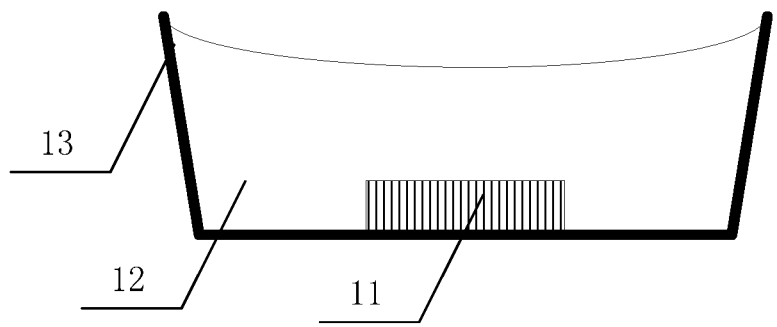
FIG. 8 is another schematic diagram of another LED package structure provided by the first embodiment of the present disclosure.
Figure 9:
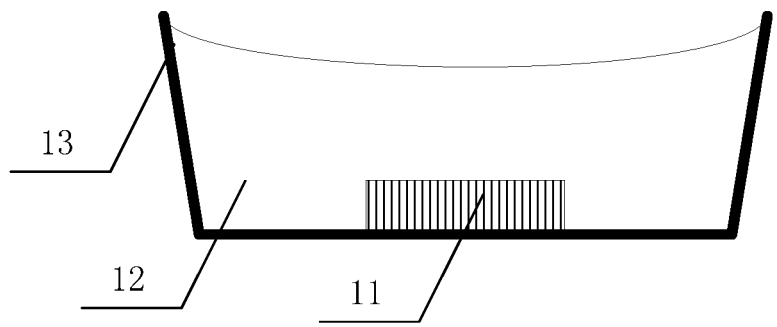
FIG. 9 is another schematic diagram of another LED package structure provided by the first embodiment of the present disclosure.

FIG. 7 shows the case that the wavelength converting layer 12 is in a shape of flat-top-cup. However, in other cases, the wavelength converting layer 12 may be in a shape of convex-top-cup or concave-top-cup. FIG. 8 is another schematic diagram of another LED package structure provided by the first embodiment of the present disclosure. FIG. 9 is another schematic diagram of another LED package structure provided by the first embodiment of the present disclosure. More particularly, FIG. 8 shows the case that the wavelength converting layer 12 is in a shape of convex-top-cup, and FIG. 9 shows the case that the wavelength converting layer 12 is in a shape of concave-top-cup.

Furthermore, there is no limitation on the number of the LED chip 11 in the present embodiment, and the number of the LED chip 11 may be one or more. However, either in the case of one LED chip or in the case of a plurality of LED chips, the phenomenon of yellow halo may be alleviated by decreasing the distance between the LED chip 11 and the bowl-like cup 13. This is because as the distance between the LED chip 11 and the bowl-like cup 13 increases, the amount of phosphor around the LED chip 11 increases, and the color temperature decreases. According to the changing trend as indicated by the curve in FIG. 2, it can be understood that in a portion with larger emitting angles, the difference of the color temperatures between this portion and the central portion of the LED chip 11 may be larger, and thus the phenomenon of yellow halo may be worse. Preferably, the distance between the LED chip 11 and the sidewalls of bowl-like cup 13 may be controlled to be less than 0.7 mm.

Second Embodiment

The wavelength converting layer 12 recited in the first embodiment may be in a structure of single layer or a structure with a plurality of layers. In the present embodiment, based on the LED package structure provided by the first embodiment, the second embodiment provides an example that the wavelength converting layer 12 is in a structure with a plurality of layers for better clarification of the structure with a plurality of layers.

Figure 10:
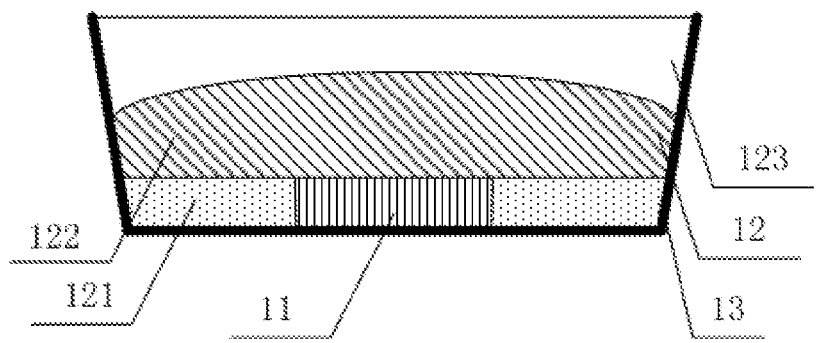
FIG. 10 is a schematic diagram of a LED package structure provided by the second embodiment of the present disclosure.

FIG. 10 is a schematic diagram of a LED package structure provided by the second embodiment of the present disclosure. As shown in FIG. 10, the wavelength converting layer 12 may include a first wavelength converting sub-layer 121 and a second wavelength converting sub-layer 122.

It should be noted that, the LED package structure shown in FIG. 10 includes a bowl-like cup 13 for the sake of convenience of description, but in other cases, the bowl-like cup 13 may be excluded from the LED package structure. Therefore, the bowl-like cup 13 shown in FIG. 10 may be merely an example, and is not required for implementation of the present embodiment.

The amount of red phosphor in the first wavelength converting sub-layer 121 may be less than that of red phosphor in the second wavelength converting sub-layer 122. The first wavelength converting sub-layer 121 may be provided around the outer walls of the LED chip 11, and the second wavelength converting sub-layer 122 may cover the upper surface of the LED chip 11. Alternatively, the second wavelength converting sub-layer 122 may cover the upper surface of the LED chip 11 and a part of or the entire upper surface of the first wavelength converting sub-layer 121. In the structure shown in FIG. 10 containing the bowl-like cup, the second wavelength converting sub-layer 122 covers the entire upper surface of the first wavelength converting sub-layer 121.

Meanwhile, the first wavelength converting sub-layer 121 may cover a part of or the entire upper surface of the LED chip 11. This is because the first wavelength converting sub-layer 121 is obtained by a series of processes such as dispensing and curing in the process, and during the process of dispensing, the dispensing amount is directly related with whether or not the first wavelength converting sub-layer 121 covers the LED chip 11. When the dispensing amount is less, the upper surface of the LED chip 11 may be uncovered, and when the dispensing amount is more, the upper surface of the LED chip 11 may be partly or entirely covered. The technical effect of the present embodiment may not be affected by the fact whether or not the first wavelength converting sub-layer 121 covers the upper surface of the LED chip 11. If the first wavelength converting sub-layer 121 may cover a part of or the entire upper surface of the LED chip 11, the difficulty of the process may be lowered and it is unnecessary to precisely control the dispensing amount upon dispensing.

Furthermore, in the case that the structure includes the bowl-like cup 13, the first wavelength converting sub-layer 121 may be filled between the LED chip 11 and the inner wall of the bowl-like cup 13. The second wavelength converting sub-layer 122 may cover the upper surface of the LED chip 11 and the upper surface of the first wavelength converting sub-layer 121, and the sidewall of the second wavelength converting sub-layer 122 may be attached to the inner wall of the bowl-like cup 13.

In the structure of the present embodiment, the amount of red phosphor is lower in the edge portion than in the central portion in the LED chip when the above wavelength converting layer of two-layer structure is used, and thus the generation of the phenomenon of yellow halo may be reduced effectively. Furthermore, it may be easy for the two-layer structure of wavelength converting layer to be operated in production process by configuring two kinds of adhesive with different amounts of red phosphor, and then performing the process of dispensing twice sequentially. Detailed description would be made on the specific processing processes in the following. More particularly, in the following, some specific structures applicable to the above two-layer wavelength converting layer would be described in detail in the following aspects.

(1) The Amount of Red Phosphor

As an exemplary embodiment, the amount of red phosphor in the first wavelength converting sub-layer 121 may be less than 50% of the amount of red phosphor in the second wavelength converting sub-layer 122.

Preferably, the amount of red phosphor in the first wavelength converting sub-layer 121 may be zero. That is to say, there is no red phosphor included in the first wavelength converting sub-layer 121. For example, there are only yellow phosphor and/or green phosphor included in the first wavelength converting sub-layer 121. That is to say, there may be only yellow phosphor included in the first wavelength converting sub-layer 121, or there may be only green phosphor included in the first wavelength converting sub-layer 121. Furthermore, there may be mixed phosphor consisted of yellow phosphor and green phosphor.

When there is no red phosphor included in the first wavelength converting sub-layer 121, on one hand, the blue light emitted from the LED chip may not excite red phosphor to generate red light, and on the other hand, the excited green light and/or yellow light may not further excite red phosphor to generate red light, either. Therefore, the whole color temperature of the light emitted from edge portion of the LED chip may be increased due to the decreasing or even vanishing of the red light of low color temperature, and thus the phenomenon of yellow halo may be alleviated.

(2) Additional Optical Mechanism in the First Wavelength Converting Sub-Layer

Furthermore, to further improve the color temperature of edge portion, an optical mechanism for improving strength of blue light in edge portion may be provided in the first wavelength converting sub-layer 121. With such optical mechanism, the first wavelength converting sub-layer 121 may improve the strength of blue light, while reducing the excited red light, so that the phenomenon of yellow halo may be alleviated more effectively.

Figure 11:
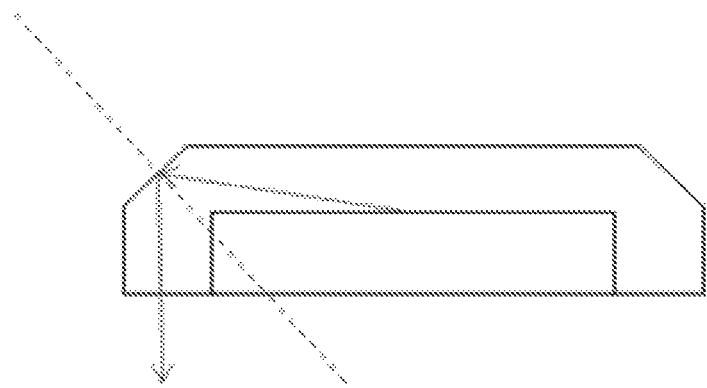
FIG. 11 is a schematic diagram of an optical apparatus provided by the second embodiment.

For example, FIG. 11 is a schematic diagram of an optical mechanism. The light path inside the optical mechanism is as shown in FIG. 11, and the optical mechanism may adjust the angle of the optical interface so that the blue light emitted from the center of the LED chip may be total reflected upon being transmitted to the optical interface of the optical mechanism after being incident into the optical mechanism, and then the total-reflected blue light may be emitted out of the optical mechanism from edge portion of the LED chip.

(3) Shape of the Second Wavelength Converting Sub-Layer

The second wavelength converting sub-layer 122 may have a convex-top-cup structure, or may have a concave-top-cup structure or flat-top-cup structure. Preferably, as shown in FIG. 10, the second wavelength converting sub-layer 122 may have a convex-top-cup structure.

With such second wavelength converting sub-layer 122 using the convex-top-cup structure, on one hand, the wavelength converting layer may absorb more blue light in the central portion where blue light emitted from the LED chip 11 is strong, and on the other hand, the wavelength converting layer may absorb less blue light in the edge portion where blue light emitted from the LED chip 11 is weak, and thus the uniformity of emitting light may be adjusted.

Figure 12:
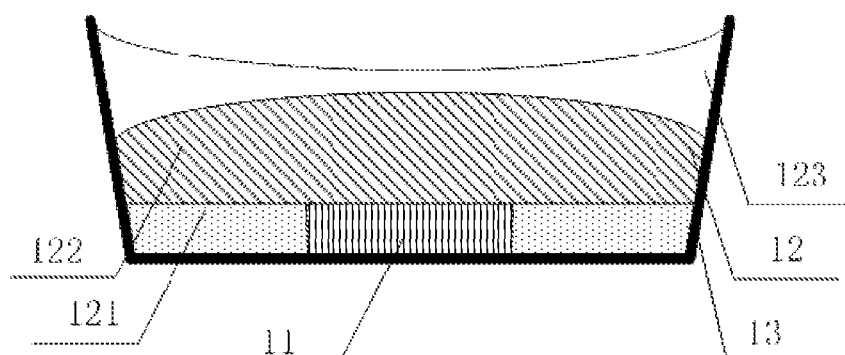
FIG. 12 is another schematic diagram of the LED package structure provided by the second embodiment of the present disclosure.
Figure 13:
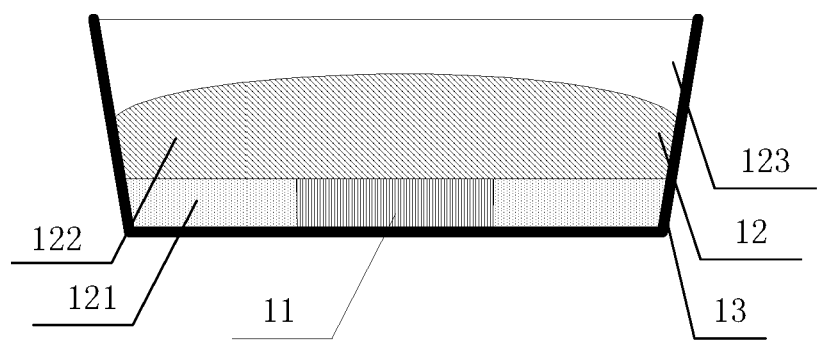
FIG. 13 is another schematic diagram of the LED package structure provided by the second embodiment of the present disclosure.
Figure 14:
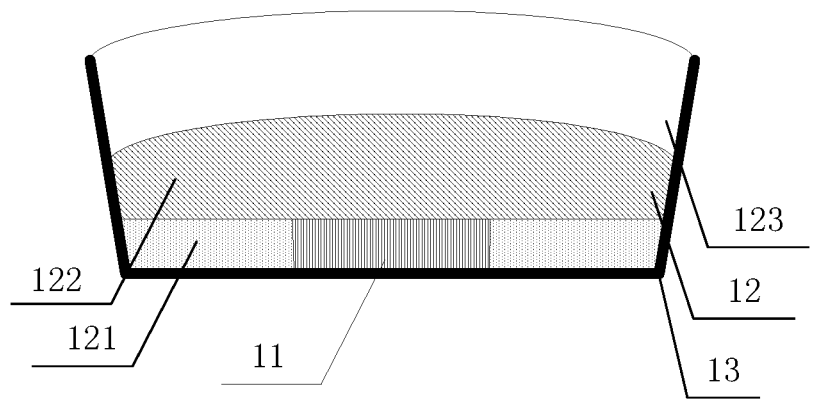
FIG. 14 is another schematic diagram of the LED package structure provided by the second embodiment of the present disclosure.
Figure 15:
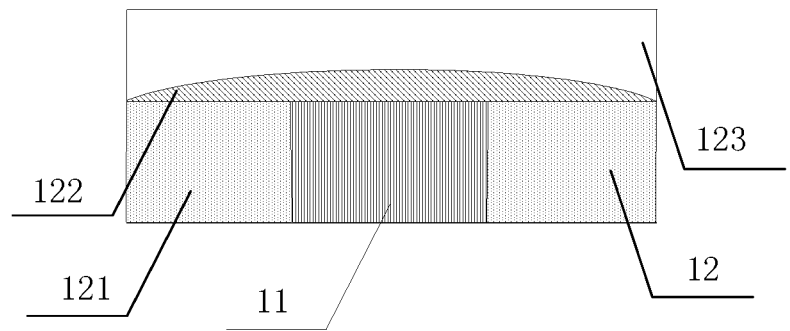
FIG. 15 is another schematic diagram of the LED package structure provided by the second embodiment of the present disclosure.

Furthermore, based on the two-layer structure of wavelength converting layer, a transparent adhesive layer 123, i.e., an adhesive layer without phosphors, may be further included. The transparent adhesive layer 123 may be provided on the second wavelength converting sub-layer 122 and used for adjusting the emitting angle of light so that the light emitting effects may be improved. The transparent adhesive layer 123 may be formed in a form of concave-top-cup, convex-top-cup and flat-top-cup. On one hand, in the case that the bowl-like cup 13 is included, the structure as shown in FIG. 12-14 may be formed, in which, FIG. 12 shows a form of concave-top-cup, FIG. 13 shows a form of flat-top-cup, and FIG. 14 shows a form of convex-top-cup. On the other hand, in the case that the bowl-like cup 13 is not included, the transparent adhesive layer 123 may be also formed in to the form of concave-top-cup, convex-top-cup and flat-top-cup. As a typical application, FIG. 15 shows a form of flat-top-cup, but skills in the art may derive the form of concave-top-cup or convex-top-cup based on the form shown in FIG. 15, which may be not described in the present embodiment so as to avoid redundant.

Third Embodiment

In addition to the providing of the LED package structure provided by the first embodiment or the second embodiment, the distribution of the amount of whole phosphor may be adjusted. In the present embodiment, the amount of phosphor in the wavelength converting layer 12 is higher in the central portion than in the edge portion in the LED chip 11. The amount of phosphor mentioned herein refers to the whole amount of phosphor, i.e., the total amount of various kinds of phosphor.

It should be noted that, the amount of phosphor as cited herein refers to an absolute amount of phosphor, or the mass of phosphor.

As an exemplary example, the thickness of the wavelength converting layer 12 may be maintained same from the central portion to the edge portion in the LED chip 11, and the density of the phosphor including yellow and/or green phosphor in the wavelength converting layer 12 may be higher in the central portion than in the edge portion in the LED chip 11.

As another exemplary example, the density of the phosphors including yellow and/or green phosphors in the wavelength converting layer 12 may be the same everywhere, but the thickness of the wavelength converting layer 12 may be higher in the central portion than in the edge portion in the LED chip 11. Therefore, the LED package structure as shown in FIG. 4, FIG. 9, FIG. 10, or FIG. 14 may be formed.

In the present embodiment, with the amount of phosphor in the wavelength converting layer higher in the central portion than in the edge portion in the LED chip, on one hand, the wavelength converting layer may absorb more blue light in the central portion where blue light emitted from the LED chip 11 is strong, and on the other hand, the wavelength converting layer may absorb less blue light in the edge portion where blue light emitted from the LED chip 11 is weak, and thus the strength and the color temperature of emitting light may be more uniform in the range of all emitting angles.

Fourth Embodiment

The present embodiment provides a LED light-emitting device, which may include the LED package structure in each embodiment as described above. In the perspective of light-emitting effect, the LED light-emitting device, i.e., the dominant wavelength of the LED light-emitting device may maintain stable at each emitting angles.

Figure 16:
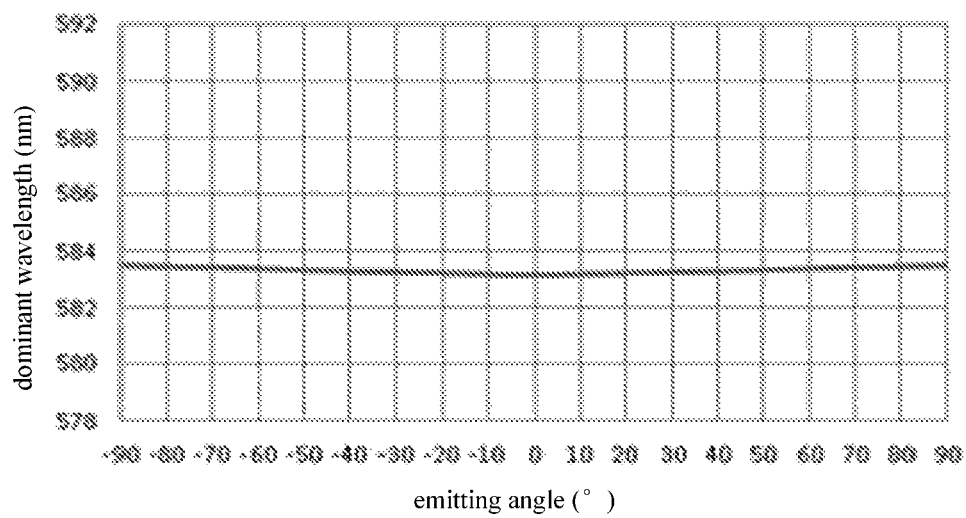
FIG. 16 is an experimental diagram showing a changing rate of a dominant wavelength of the LED light-emitting device.

More particularly, FIG. 16 is an experimental diagram showing a changing rate of a dominant wavelength of the LED light-emitting device. In normal cases, at an emitting angle in a range of −90° to +90°, the changing rate of the dominant wavelength of the LED light-emitting device may be less than 7%. That is to say, the difference between the dominant wavelength at the emitting angle of 0° and the dominant wavelength at the emitting angle of 80° is less than 7%.

It should be noted that, the value of 7% is merely an example, and in other cases, the maximum of the difference may be less than 7%, e.g., 5%.

The LED light-emitting device may include the LED package structure in any of the foregoing first to third embodiment.

More particularly, the LED light-emitting device may include a LED chip and a wavelength converting layer covering the LED chip. As an exemplary example, in the wavelength converting layer, the distribution of the phosphor is non-uniform. The expression that "the distribution of the phosphor is non-uniform" refers to such cases, for example, that the density of phosphor in different portions in the wavelength converting layer may be different, that the particles of the phosphor may be different in size, and that the distribution of the density of the phosphor in different regions may be different. The cases mentioned here may exist alone or in combination and there is no limitation.

The non-uniform wavelength converting layer may be implemented by the wavelength converting layer in the LED package structure of any of the first to third embodiments. Therefore, the color temperature of the LED light-emitting device may be more uniform and the phenomenon of yellow halo may be alleviated.

Fifth Embodiment

The present embodiment provides a LED light-emitting device, which may include the LED package structure in each embodiment as described above. More particularly, the LED light-emitting device may include a LED chip and a wavelength converting layer, wherein the amount of the red phosphor in the wavelength converting layer may be lower in the edge portion than in the central portion in the LED chip. In the perspective of light-emitting effect, the LED light-emitting device, i.e., the color temperature of the LED light-emitting device may maintain stable at each emitting angle.

More particularly, in normal cases, at an emitting angle in a range of −90° to +90°, the changing rate of the color temperature of the LED light-emitting device may be less than 7%. That is to say, the difference between the color temperature at the emitting angle of 0° and the color temperature at the emitting angle of 80° is less than 7%.

It should be noted that, the value of 7% is merely an example, and in other cases, the maximum of the difference may be less than 7%, e.g., 5%.

The LED light-emitting device may include the LED package structure in any of the foregoing first to third embodiment.

More particularly, the LED light-emitting device may include a LED chip and a wavelength converting layer covering the LED chip. As an exemplary example, in the wavelength converting layer, the distribution of the phosphor is non-uniform. The expression that "the distribution of the phosphor is non-uniform" refers to such cases that the density of phosphor in different portions in the wavelength converting layer may be different, that the particles of the phosphor may be different in size, and that the distribution of the density of the phosphor in different regions may be different. The cases mentioned here may exist alone or in combination and there is no limitation.

The non-uniform wavelength converting layer may be implemented by the wavelength converting layer in the LED package structure of any of the first to third embodiments. Therefore, the color temperature of the LED light-emitting device may be more uniform and the phenomenon of yellow halo may be alleviated.

Sixth Embodiment

Figure 17:
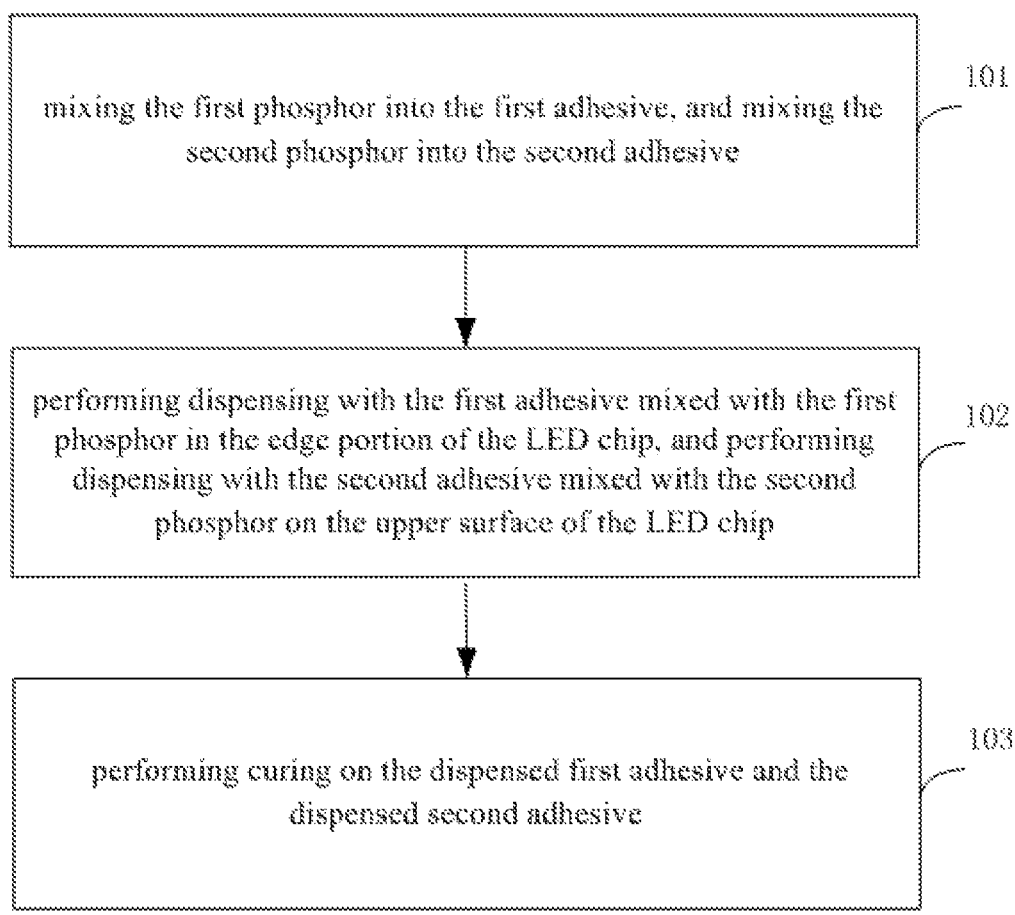
FIG. 17 is a flowchart showing a phosphor coating method provided by the sixth embodiment of the present disclosure.

The phosphor coating method provided by the present embodiment is directed to manufacturing the LED package structure including a wavelength converting layer in a two-layer structure provided by the second embodiment. In the present embodiment, the wavelength converting layer may be a phosphor adhesive layer mixed with phosphors. FIG. 17 is a flowchart showing a phosphor coating method provided by the sixth embodiment of the present disclosure. As shown in FIG. 17, the method includes the following steps:

Step 101, mixing the first phosphor into the first adhesive, and mixing the second phosphor into the second adhesive.

The amount of red phosphor in the first phosphor may be lower than the amount of red phosphor in the second phosphor (the amount of red phosphor in the first phosphor may be zero), and the viscosity of the first adhesive may be lower than the viscosity of the second adhesive.

More particularly, the first adhesive and the second adhesive may have same refractive index or different refractive index. For example, in a high-power LED chip, the first adhesive may have low refractive index, and the second adhesive may have high refractive index, while in a low-power LED chip, the first adhesive may have high refractive index, and the second adhesive may have low refractive index. It should be noted that, the high refractive index refers to a refractive index greater than 1.5, and the low refractive index refers to a refractive index less than 1.5. High power refers to a power greater than 1 W, and low power refers to a power less than 1 W.

Preferably, the first adhesive and the second adhesive may be adjusted to have different viscosity, so that the phosphors can be controlled to be mixed with different deposit rate so as to be precipitated and layered. More particularly, the adhesive may be blended with diluents to have different viscosity.

Step 102, performing dispensing with the first adhesive mixed with the first phosphor in the edge portion of the LED chip, and performing dispensing with the second adhesive mixed with the second phosphor on the upper surface of the LED chip. During dispensing, the second adhesive may cover a part of or the entire upper surface of the first adhesive.

More particularly, if the viscosity of the first adhesive is inadequate, a mold with center protruded may be used to perform dispensing with the second adhesive mixed with the second phosphor on the upper surface of the LED chip; if the viscosity of the first adhesive is adequate, a adhesive-dripping manner for dispensing may be used to perform dispensing with the second adhesive mixed with the second phosphor on the upper surface of the LED chip.

Step 103, performing curing on the dispensed first adhesive and the dispensed second adhesive.

More particularly, the process of curing may be performed by the following way: performing curing on the dispensed second adhesive after performing curing on the dispensed first adhesive; or performing curing on the dispensed second adhesive after performing curing on the dispensed second adhesive.

In the present embodiment, the LED package structure including a wavelength converting layer in a two-layer structure in which the amounts of red phosphor are different by performing the processes of mixing, dispensing, and curing of phosphor sequentially. More particularly, the first adhesive being dispensed first may be formed on the edge portion of the LED chip so as to form the first wavelength converting sub-layer in the forgoing second embodiment, and the second adhesive being dispensed after the first adhesive may be formed on the upper surface of the LED chip, so as to form the second wavelength converting sub-layer in the forgoing second embodiment. With the LED package structure including a wavelength converting layer in a two-layer structure provided by the present embodiment, direct or indirect exciting of red light may be avoided in the edge portion of the LED chip, so that the color temperature of the edge portion may be adjusted toward to high color temperature and thus the phenomenon of yellow halo may be alleviated.

Seventh Embodiment

Figure 18:
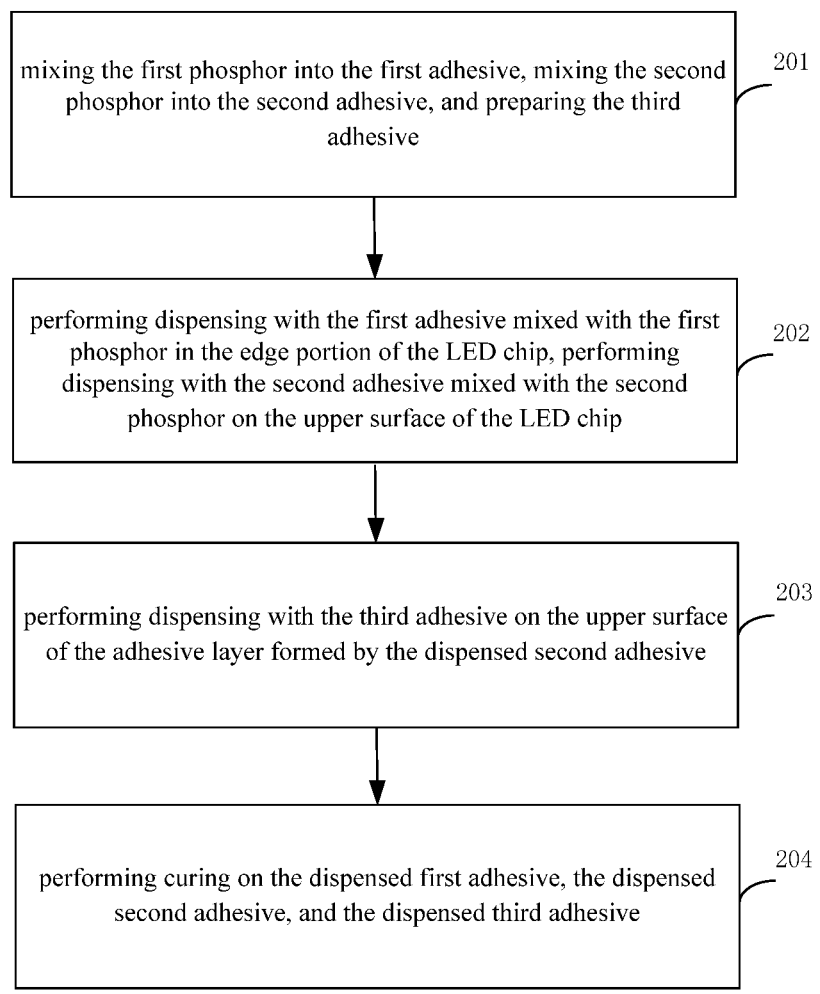
FIG. 18 is another flowchart showing a phosphor coating method provided by the seventh embodiment of the present disclosure.

The phosphor coating method provided by the present embodiment is directed to manufacturing the LED package structure including a wavelength converting layer in a three-layer structure provided by the second embodiment. In the present embodiment, the wavelength converting layer may be a phosphor adhesive layer mixed with phosphors. FIG. 18 is a flowchart showing a phosphor coating method provided by the seventh embodiment of the present disclosure. As shown in FIG. 18, the method includes the following steps:

Step 201, mixing the first phosphor into the first adhesive, mixing the second phosphor into the second adhesive, and preparing the third adhesive.

The amount of red phosphor in the first phosphor may be lower than the amount of red phosphor in the second phosphor, and the amount of phosphor in the third phosphor may be zero, and the viscosity of the first adhesive may be lower than the viscosity of the second adhesive, and there is no limitation on the viscosity of the third adhesive.

More particularly, the first adhesive, the second adhesive, and the third adhesive may have same refractive index or different refractive index. For example, in a high-power LED chip, the first adhesive may have low refractive index, the second adhesive may have high refractive index or low refractive index, and the third adhesive may have high refractive index, while in a low-power LED chip, the first adhesive may have high refractive index, the second adhesive may have high or low refractive index, and the third adhesive may have high refractive index.

Step 202, performing dispensing with the first adhesive mixed with the first phosphor in the edge portion of the LED chip, performing dispensing with the second adhesive mixed with the second phosphor on the upper surface of the LED chip. During dispensing, the second adhesive may cover a part of or the entire upper surface of the first adhesive.

Step 203, performing dispensing with the third adhesive on the upper surface of the adhesive layer formed by the dispensed second adhesive. More particularly, the third adhesive may be dispensed in the way of adhesive-dripping.

Step 204, performing curing on the dispensed first adhesive, the dispensed second adhesive, and the dispensed third adhesive.

More particularly, the process of curing may be performed by the following way: performing curing on the dispensed third adhesive before performing curing on the dispensed first adhesive and the dispensed second adhesive; performing curing on the dispensed third adhesive after performing curing on the dispensed first adhesive and the dispensed second adhesive; or performing curing on the dispensed third adhesive between performing curing on the dispensed second adhesive and performing curing on the dispensed first adhesive.

In the present embodiment, the LED package structure including a wavelength converting layer in a two-layer structure in which the amounts of red phosphor are different by performing the processes of mixing, dispensing, and curing of phosphor sequentially, and the transparent adhesive layer in the second embodiment is further formed on the two-layer structure. With the LED package structure including a wavelength converting layer in a two-layer structure and further including a transparent adhesive layer provided by the present embodiment, direct or indirect exciting of red light may be avoided in the edge portion of the LED chip, so that the color temperature of the edge portion may be adjusted toward to high color temperature and thus the phenomenon of yellow halo may be alleviated. Furthermore, the transparent adhesive layer may perform adjustment on the emitting angle of emitting light so that the effect of light emitting may be improved.

It should be noted that the foregoing embodiments are merely used to illustrate the technical solution of the present disclosure, and not to limit the present disclosure. Although the present disclosure has been described in detail with reference to the foregoing embodiments, one skilled in the art would understand that the technical solutions recited in the foregoing embodiments may be modified or all or a part of the technical features may be replaced equally. These modifications and replacements are not intended to make corresponding technical solution depart from the scope of the technical solution of embodiments of the present disclosure.

What is claimed is:

1. A LED package structure, comprising:
a LED chip;
a first wavelength converting sub-layer surrounding said LED chip; and
a second wavelength converting sub-layer above said LED chip and covering said LED chip;
wherein amount of red phosphor in the second wavelength converting sub-layer decreases from a central portion of the LED chip to an edge portion of the LED chip,
wherein the first wavelength converting sub-layer has a first red phosphor mixture ratio, the second wavelength converting sub-layer has a second red phosphor mixture ratio, and said first red phosphor mixture ratio is lower than said second red phosphor mixture ratio.

2. The LED package structure according to claim 1, wherein
the amount of red phosphor in the second wavelength converting layer decreases as absolute value of emitting angle increases from the central portion to the edge portion of the LED chip.

3. The LED package structure according to claim 2, wherein the amount of red phosphor is determined by a density of red phosphor and a volume of the second wavelength converting layer.

4. A LED light-emitting device, comprising:
a LED package structure comprising:
a LED chip;
a first wavelength converting sub-layer surrounding said LED chip; and
a second wavelength converting sub-layer above said LED chip and covering said LED chip;
wherein amount of red phosphor in the second wavelength converting sub-layer decreases from a central portion of the LED chip to an edge portion of the LED chip; and
wherein a dominant wavelength of the LED light-emitting device maintaining stable at each emitting angle,
wherein the first wavelength converting sub-layer has a first red phosphor mixture ratio, the second wavelength converting sub-layer has a second red phosphor mixture ratio, and said first red phosphor mixture ratio is lower than said second red phosphor mixture ratio.

5. The LED light-emitting device according to claim 4, wherein the distribution of phosphor in the second wavelength converting layer is non-uniform.

6. The LED light-emitting device according to claim 5, wherein a difference between a first dominant wavelength at an emitting angle of 0° and a second dominant wavelength at an emitting angle of 80° is less than 7%.

7. A LED light-emitting device, comprising:
a LED package structure comprising:
a LED chip;
a first wavelength converting sub-layer surrounding said LED chip; and
a second wavelength converting sub-layer above said LED chip and covering said LED chip;
wherein amount of red phosphor in the second wavelength converting sub-layer decreases from a central portion of the LED chip to an edge portion of the LED chip; and
wherein color temperature of the LED light-emitting device maintaining stable at each emitting angle,
wherein the first wavelength converting sub-layer has a first red phosphor mixture ratio, the second wavelength converting sub-layer has a second red phosphor mixture ratio, and said first red phosphor mixture ratio is lower than said second red phosphor mixture ratio.

8. The LED light-emitting device according to claim 7, wherein the distribution of phosphor in the second wavelength converting layer is non-uniform.

9. The LED light-emitting device according to claim 8, wherein a difference between a first color temperature at an emitting angle of 0° and a second color temperature at an emitting angle of 80° is less than 7%.

10. The LED package structure according to claim 1, wherein said second wavelength converting sub-layer is above and covering said first wavelength converting sub-layer.

11. The LED package structure according to claim 1, wherein said second wavelength converting sub-layer has a convex top surface.

12. The LED package structure according to claim 1, further comprises a transparent adhesive layer above said second wavelength converting sub-layer.

13. The LED package structure according to claim 1, wherein said transparent adhesive layer has a concave top surface, convex top surface, or a flat top surface.

* * * * *